US006920273B2

(12) United States Patent
Knudsen

(10) Patent No.: US 6,920,273 B2
(45) Date of Patent: Jul. 19, 2005

(54) HIGH DENSITY FIBER DISTRIBUTION FRAME

(75) Inventor: Clinton M. Knudsen, St. Louis Park, MN (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 146 days.

(21) Appl. No.: 10/225,448

(22) Filed: Aug. 20, 2002

(65) Prior Publication Data

US 2004/0037533 A1 Feb. 26, 2004

(51) Int. Cl.⁷ .................................................. G02B 6/00
(52) U.S. Cl. ..................................................... 385/135
(58) Field of Search ........................... 385/53, 57, 59, 385/134–137

(56) References Cited

U.S. PATENT DOCUMENTS

| | | | |
|---|---|---|---|
| 4,715,502 A | 12/1987 | Salmon | |
| 5,497,444 A | 3/1996 | Wheeler | |
| 5,717,810 A | 2/1998 | Wheeler | |
| 5,758,003 A | 5/1998 | Wheeler et al. | |
| 5,975,315 A | 11/1999 | Jordan | |
| 6,349,837 B1 | 2/2002 | Serban | |
| 6,487,356 B1 * | 11/2002 | Harrison et al. | 385/135 |
| 6,614,978 B1 * | 9/2003 | Caveney | 385/135 |
| 6,633,717 B1 * | 10/2003 | Knight et al. | 385/135 |

FOREIGN PATENT DOCUMENTS

| | | |
|---|---|---|
| CA | 2235657 | 11/1998 |
| FR | 0538164 A1 * | 4/1993 |
| WO | WO 02/41644 A2 | 5/2002 |
| WO | WO 02/067595 A2 | 8/2002 |

OTHER PUBLICATIONS

ADC Telecommunications, Inc., Fiber Distribution Frame Products and Accessories, publication No. 804, dated Jul. 2001.
ADC Telecommunications, Inc., Next Generation Frame Product Family Ordering Guide, 5th Edition, Publication No. 820, dated Apr. 2002.
ADC Telecommunications, Inc., Next Generation Frame Product Family Ordering Guide, Publication No. 820, dated Oct. 1998.

* cited by examiner

Primary Examiner—Khiem Nguyen
(74) Attorney, Agent, or Firm—Merchant & Gould PC

(57) ABSTRACT

The present invention relates to a telecommunications equipment rack with vertical supports on which are located equipment mounting locations, cable troughs for directing cables to and from equipment mounted at the mounting locations, a base to which the vertical supports are mounted, a triangularly shaped gusset reinforcing the connection between the vertical support and the base, and an L-shaped gusset extending between the base and a horizontal bracket mounted to the vertical supports. The vertical supports are made from two U-shaped channels mounted to form a closed rectangular channel. The present invention further relates to a telecommunications equipment rack with vertical supports on which are located equipment mounting locations, cable troughs for directing cables to and from equipment mounted at the mounting locations, a base to which the vertical supports are mounted, and a lower portion of each vertical forming a triangularly shaped gusset reinforcing the connection between the vertical support and the base.

23 Claims, 16 Drawing Sheets

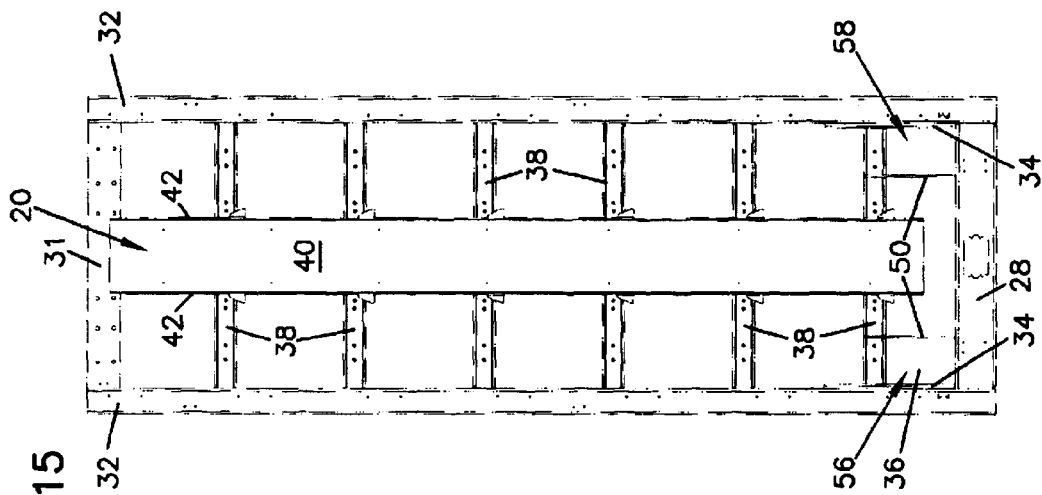
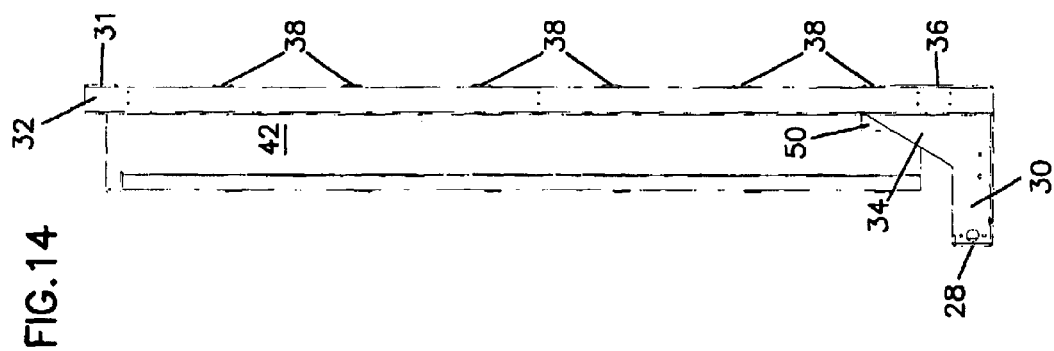

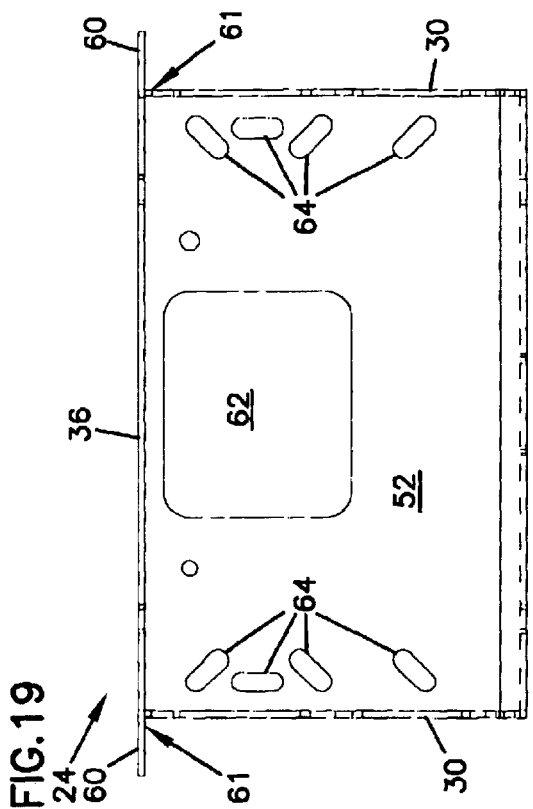
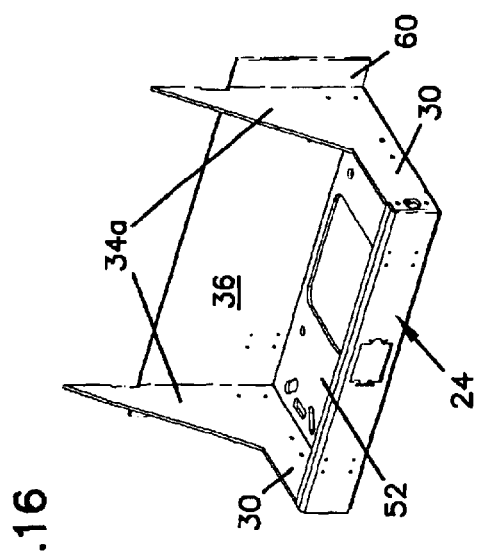
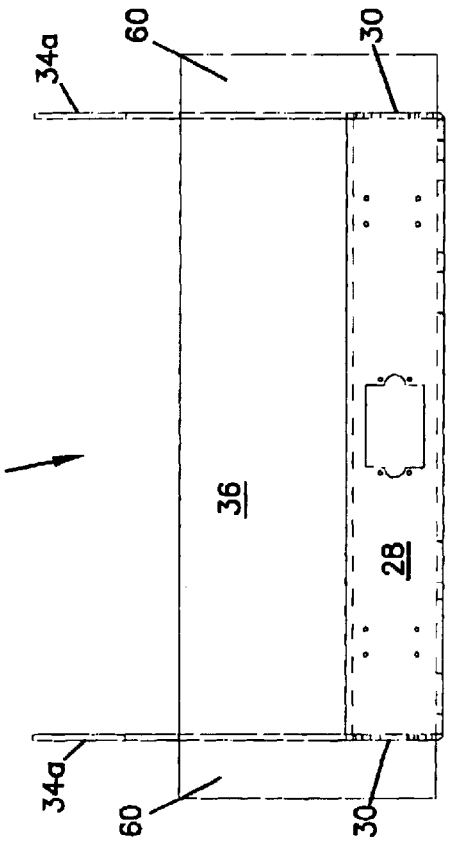

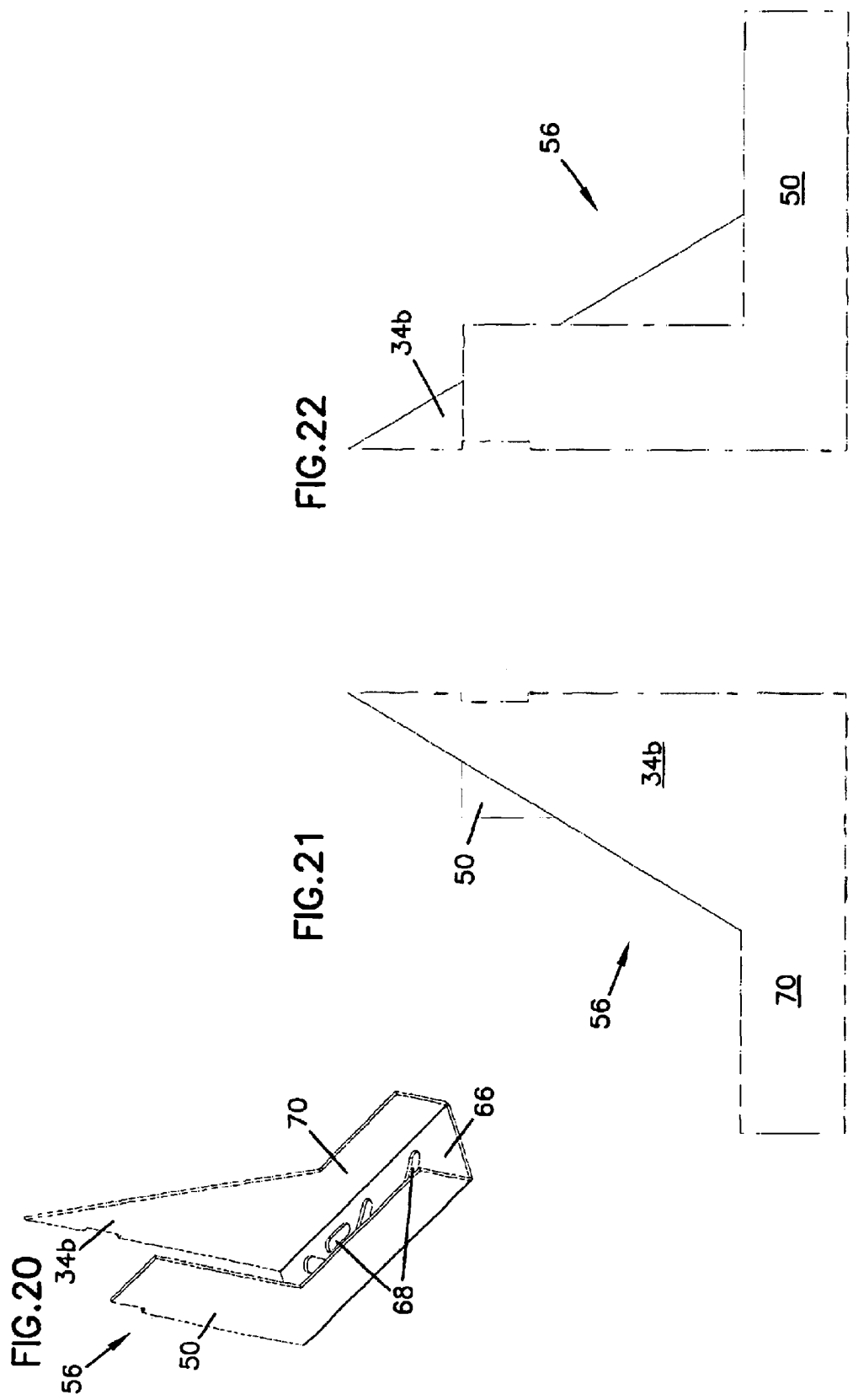

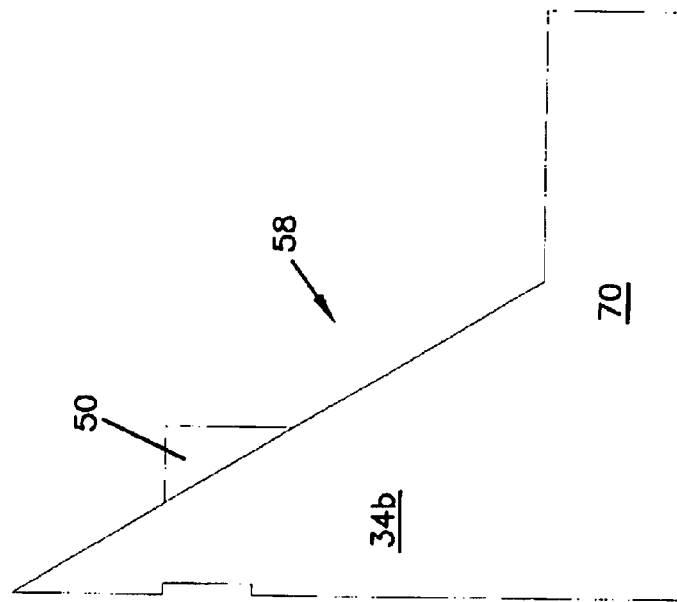
FIG. 25
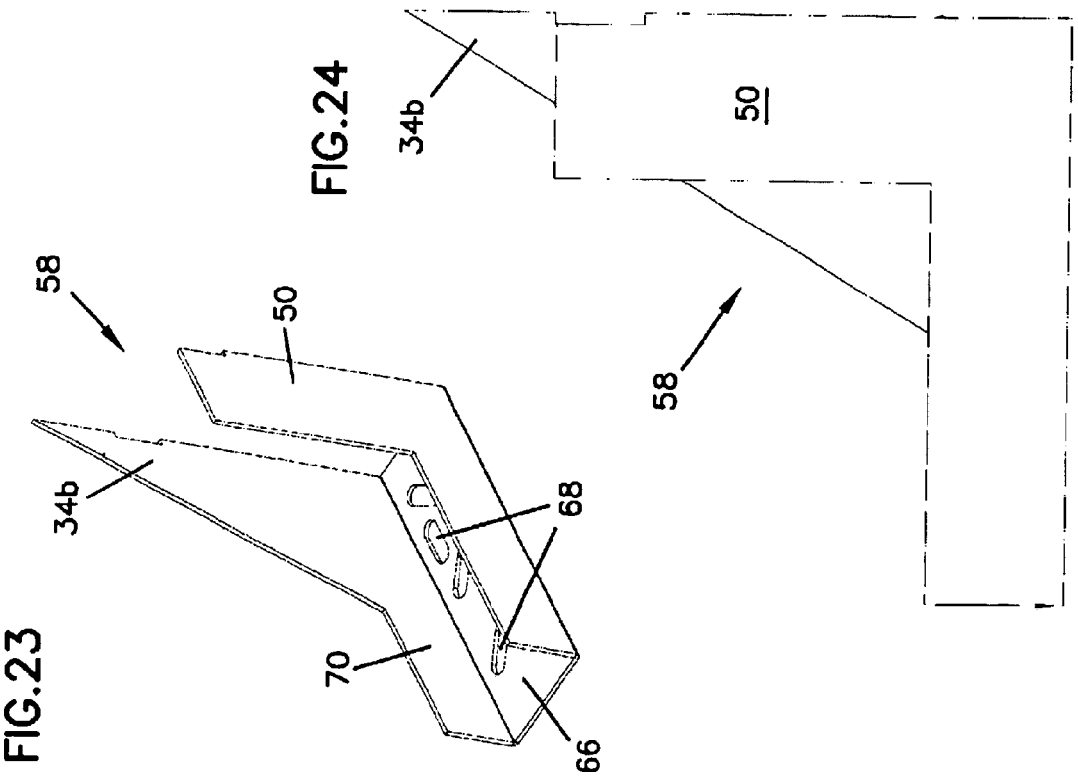
FIG. 24
FIG. 23

HIGH DENSITY FIBER DISTRIBUTION FRAME

FIELD OF THE INVENTION

The present invention relates to telecommunications equipment racks for mounting telecommunications termination and switching equipment. More specifically, the present invention relates to equipments racks which are reinforced for installation in areas potentially subject to earthquakes or similar dynamic stresses.

BACKGROUND OF THE INVENTION

Telecommunications equipment mounting racks, such as shown in U.S. Pat. No. 5,497,444, issued Mar. 5, 1996, and U.S. Pat. No. 5,758,003, issued May 26, 1998. The disclosures of these patents are incorporated herein by reference.

It is desirable that the ability of telecommunications equipment racks to withstand the dynamic loads that might be applied by an earthquake be improved to ensure that the telecommunications infrastructure is able to survive such an event. However, adding reinforcements to these known racks may interfere with equipment density, cable troughs and other cable management structures which are attached to the racks. Improvement to the reinforcement structures applied to telecommunications equipment racks to enable them to withstand strong earthquakes and other dynamic loading events while still allowing for efficient and dense terminations and cabling is desirable.

SUMMARY OF THE INVENTION

The present invention relates to a telecommunications equipment rack with vertical supports on which are located equipment mounting locations, cable troughs for directing cables to and from equipment mounted at the mounting locations, a center channel including cable slack storage structures, a base to which the vertical supports are mounted and a plurality of horizontal braces extending between the vertical supports and connected to a rear wall of the center channel. The connection between the base and each vertical support is reinforced with a triangularly shaped gusset. In addition, an L-shaped gusset extends between the base and the lowest mounted horizontal bracket. The vertical supports are made from two U-shaped channels mounted to form a closed rectangular channel.

The present invention further relates to a telecommunications equipment rack with vertical supports on which are located equipment mounting locations, cable troughs for directing cables to and from equipment mounted at the mounting locations, a center channel including cable slack storage structures, and a base to which the vertical supports are mounted. Horizontal brackets extend between the vertical supports and are connected to the rear wall of the center channel. A lower portion of each vertical forms a triangularly shaped gusset reinforcing the connection between the vertical support and the base.

BRIEF DESCRIPTION OF THE DRAWINGS

Referring now to the drawings in which like reference numbers represent corresponding parts throughout:

FIG. 14 is a side view of the rack of FIG. 11.

FIG. 15 is a front view of the rack of FIG. 11.

FIG. 16 is a front perspective view of the base of the rack of FIG. 11.

FIG. 17 is a side view of the base of FIG. 16.

FIG. 18 is a front view of the base of FIG. 16.

FIG. 19 is a top view of the base of FIG. 16.

FIG. 20 is a front perspective view of an alternative combined reinforcement structure for use on the right side of a base of a telecommunications equipment rack.

FIG. 21 is a first side view of the combined reinforcement structure of FIG. 20.

FIG. 22 is a second side view of the combined reinforcement structure of FIG. 20.

FIG. 23 is a front perspective view of an alternative combined reinforcement structure for use on the left side of a base of a telecommunications equipment rack.

FIG. 24 is a first side view of the combined reinforcement structure of FIG. 23.

FIG. 25 is a second side view of the combined reinforcement structure of FIG. 23.

DETAILED DESCRIPTION OF THE PREFERRED EMBODIMENTS

Reference will now be made in detail to the exemplary aspects of the present invention which are illustrated in the accompanying drawings. Wherever possible, the same reference numbers will be used throughout the drawings to refer to the same or like parts.

Known racks for mounting telecommunications equipment, such as the optical fiber equipment racks in the patents referenced above, provide relatively dense and scalable solutions for telecommunications installations. Such dense installations need adequate cable troughing associated with the installation to deal with the number of cables leading to and from equipment mounted within the racks. Preferably, these troughs are located in positions which allow for compatibility between cable troughing among adjacent equipment racks.

In addition to locations of cable management structures, it is desirable that the racks have the ability to withstand dynamic lateral stresses such as might be created by an earthquake. Racks which are capable of withstanding the dynamic stresses should also allow adequate cable troughing to be installed on the racks and for these cable troughs to be located in positions compatible with adjacent racks. The present invention allows telecommunications equipment racks to be sufficiently strong to withstand dynamic stresses without compromising cable management troughs.

Figure 1:
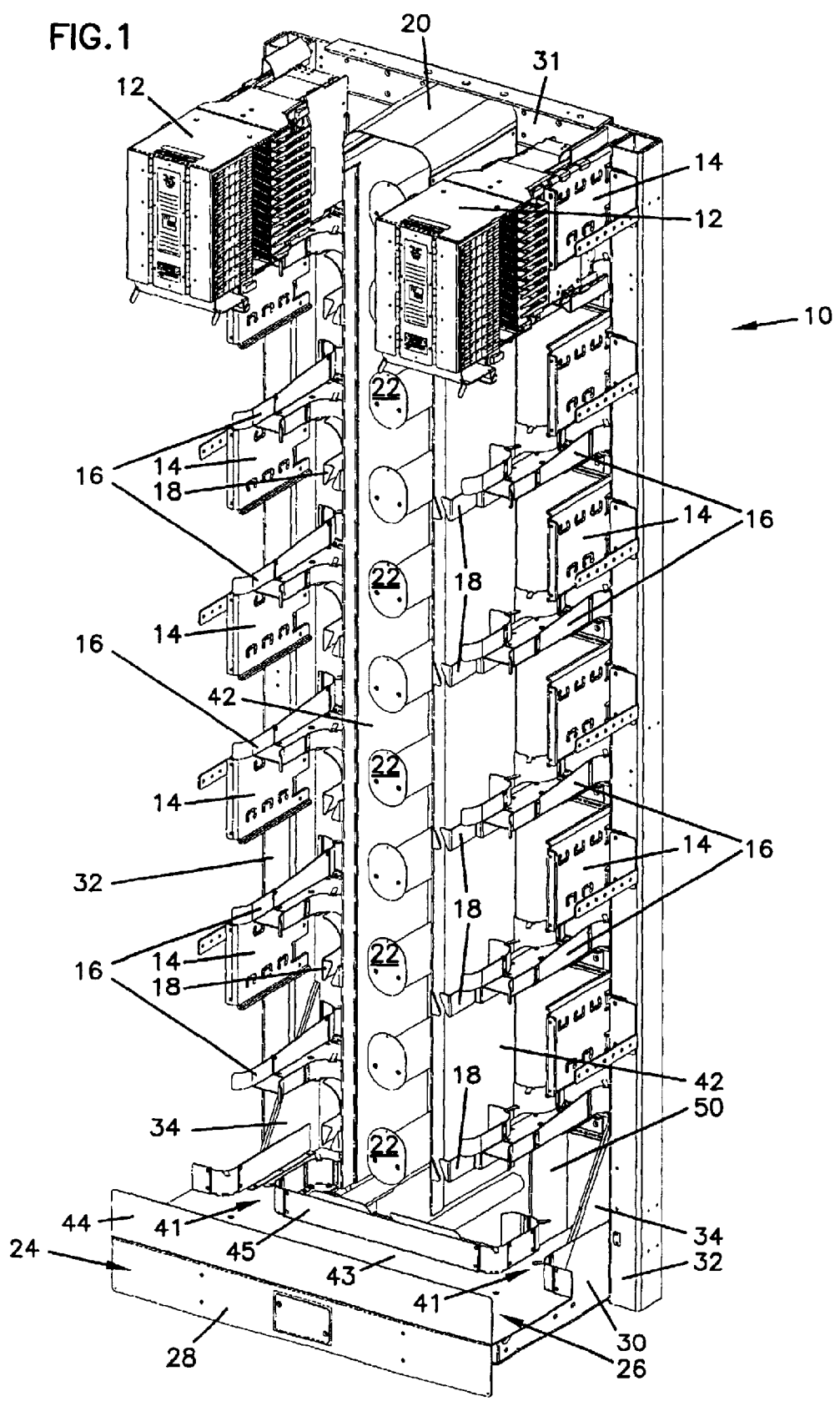
FIG. 1 is a front perspective view of a first embodiment of a telecommunications equipment rack with telecommunications equipment modules mounted according to the present invention.
Figure 2:
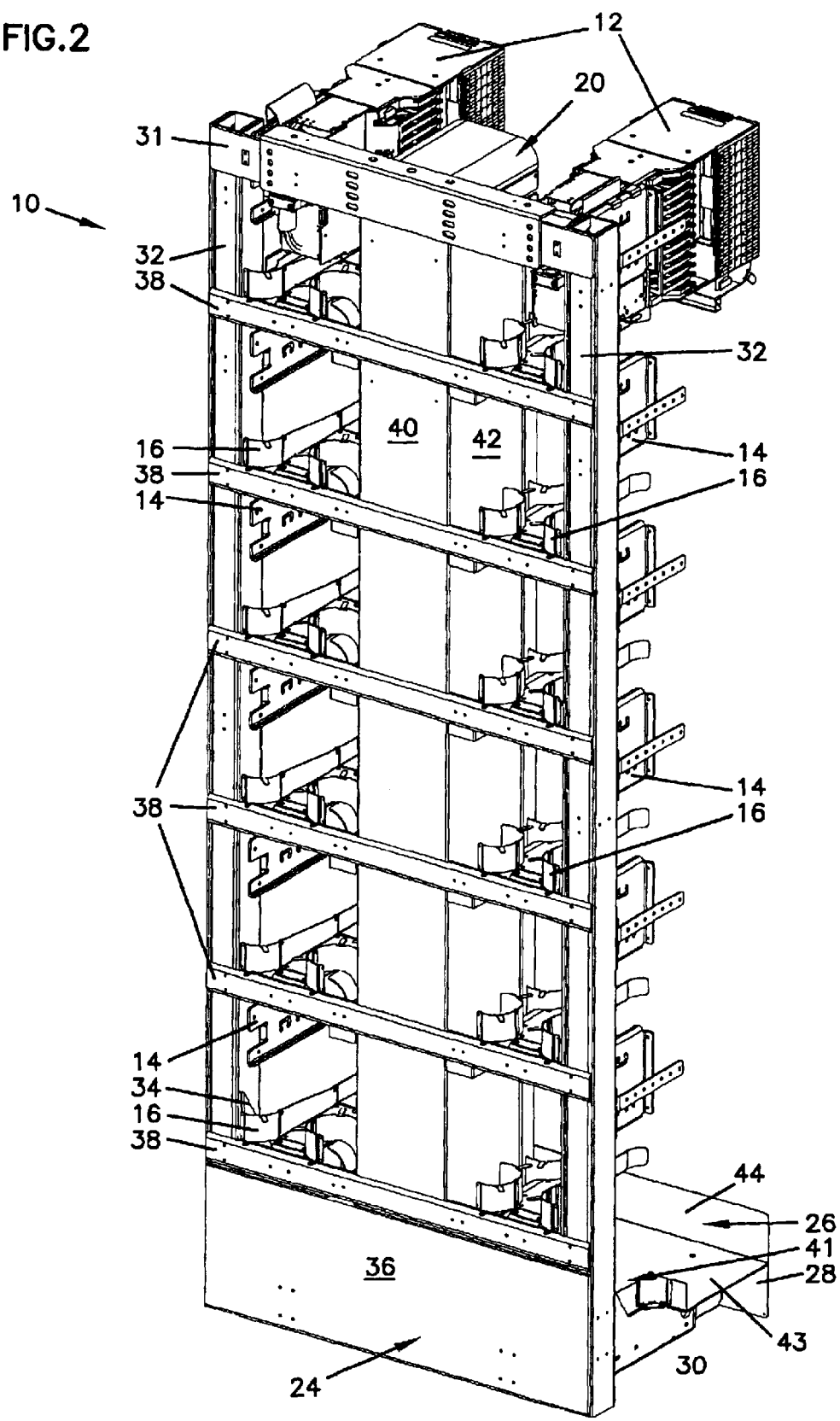
FIG. 2 is a rear perspective view of the telecommunications equipment rack of FIG. 1.

Referring now to FIGS. 1 through 5, and initially to FIG. 1, a telecommunications equipment rack 10 is shown with two pieces of telecommunications equipment such as fiber termination blocks 12 mounted to a front side. Fiber termination block 12 is described in additional detail in U.S. patent application Ser. No. 09/991,271, filed Nov. 11, 2001. It is anticipated that other termination blocks and other types of telecommunications equipment may be used with rack 10. Equipment mounts 14 are provided for two vertical columns of six fiber termination blocks 12 on rack 10. Located adjacent and beneath each mount 14 is a lower cable trough 16 positioned and configured to receive optical fiber cables extending from the front of a fiber termination block 12 mounted directly above each lower trough 16. Centrally mounted to rack 10 between the vertical columns of fiber termination blocks 12 is an open fronted vertical cable management channel 20. Referring also to FIG. 2, cable channel 20 is defined by a rear wall 40 and a pair of opposing sidewalls 42, and mounted within cable channel 20 are a plurality of cable slack storage spools 22. Mounted adjacent outer surfaces of sidewalls 42 are vertical cable guides 18. Vertical cable guides 18 cooperate to form a vertical cable channel along each side of cable channel 20 which are provided to direct optical fiber cables to and from fiber termination blocks 12.

Figure 3:
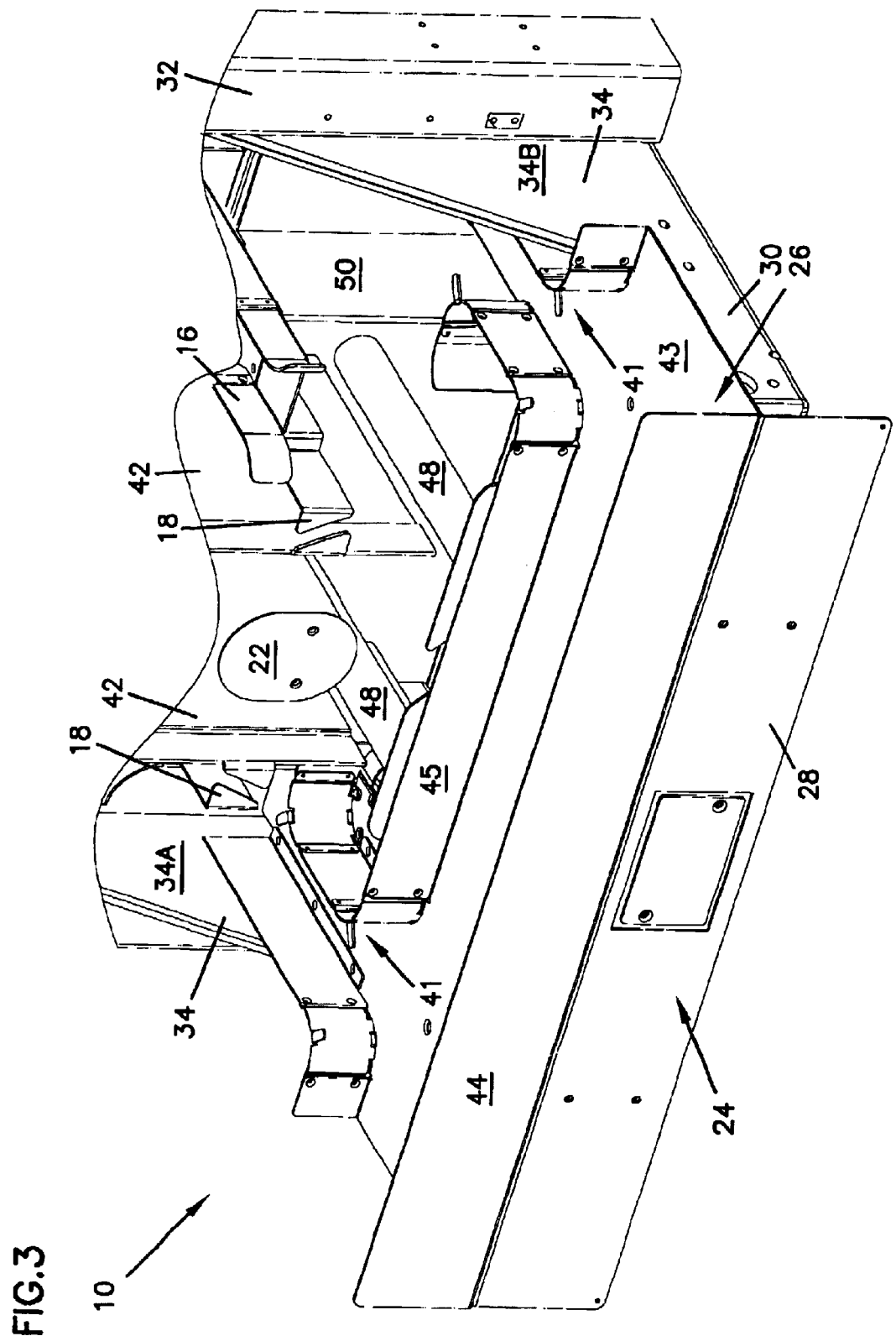
FIG. 3 is a front perspective view of the base of the telecommunications equipment rack of FIG. 1.
Figure 4:
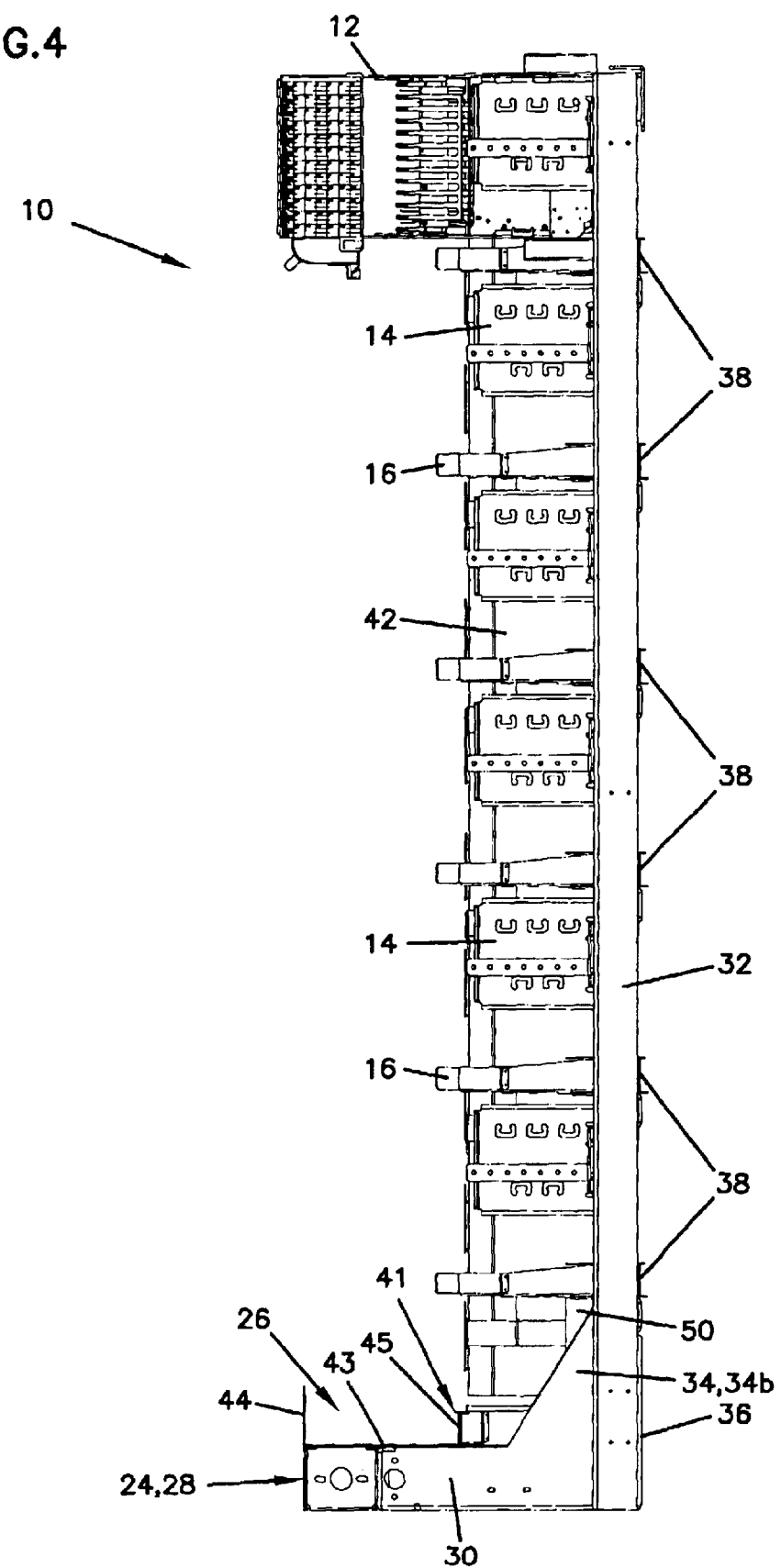
FIG. 4 is a side view of the telecommunications equipment rack of FIG. 1.
Figure 5:
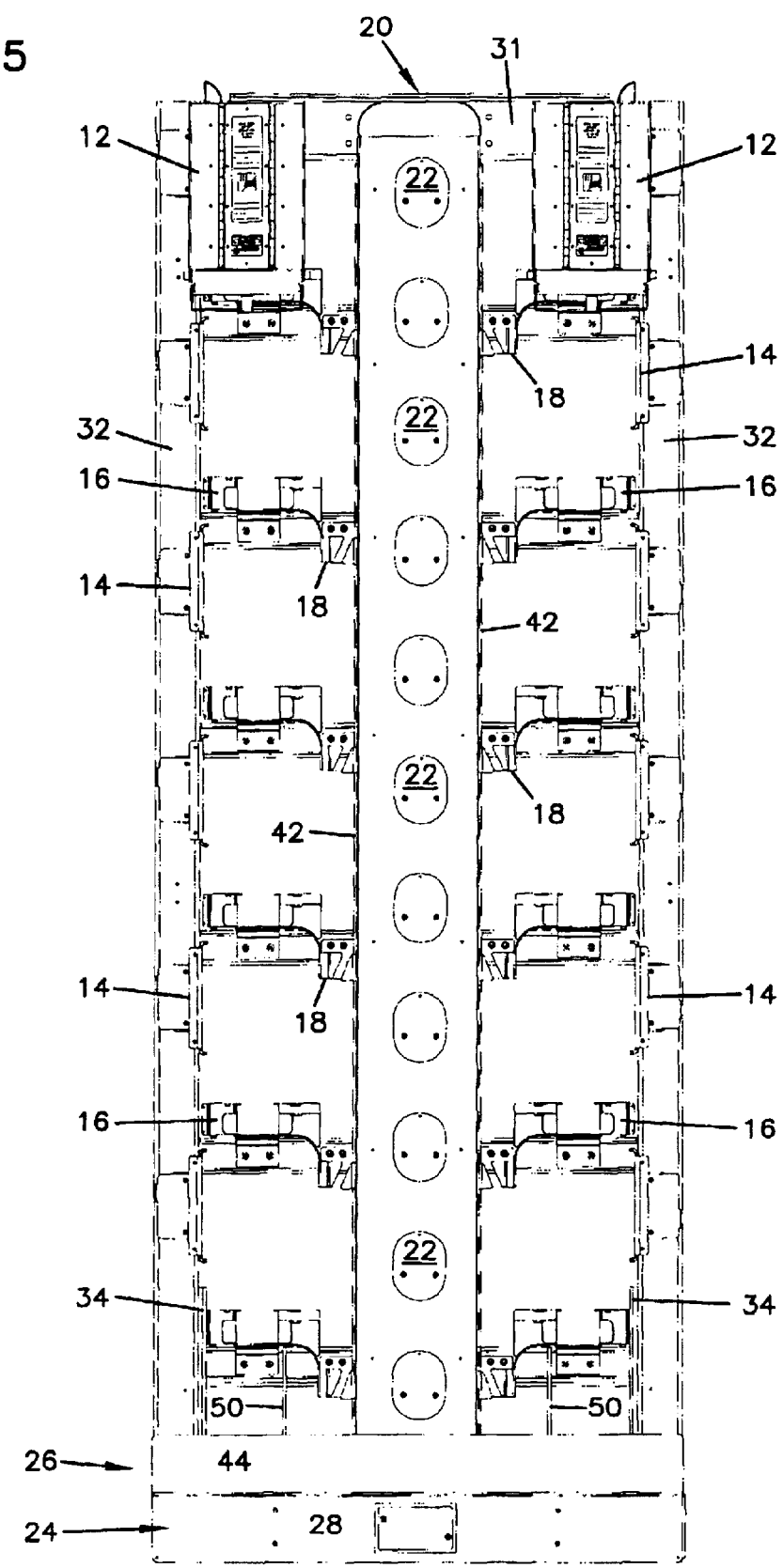
FIG. 5 is a front view of the telecommunications equipment rack of FIG. 1.
Figure 6:
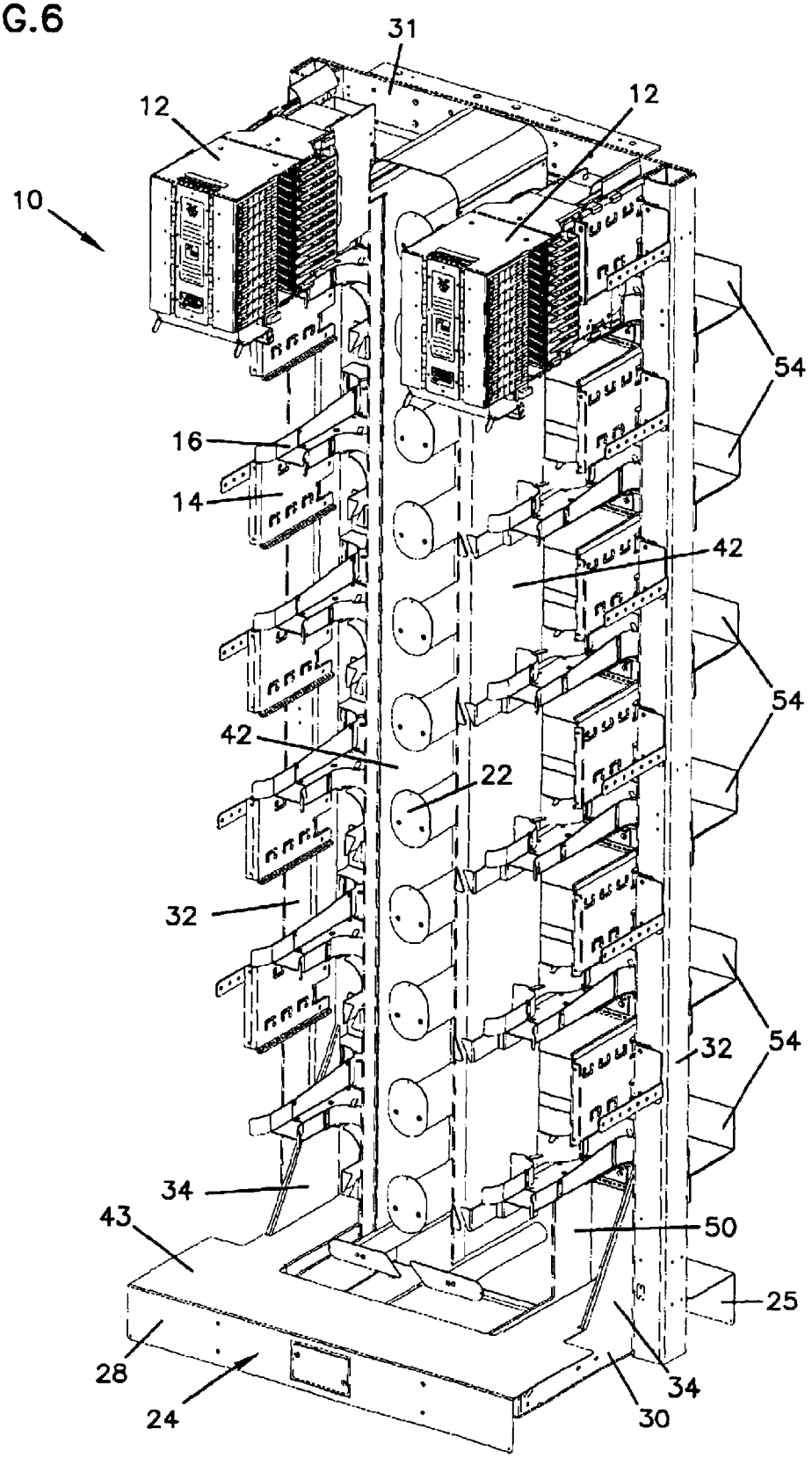
FIG. 6 is a front perspective view of a second embodiment of a telecommunications equipment rack with telecommunications equipment modules mounted according to the present invention.

Rack 10 includes a base 24 with a front wall 28, opposing sides 30, and a base rear wall 36 (see FIG. 2). Located on top of base 24 is a front cable channel 26, defined by a floor 43, which may also be a top to base 24, outer trough wall 44 and inner trough wall 45. Optical fiber cables extending within the vertical cable channel defined by guides 18 adjacent cable channel 20 may be directed through lower troughs 41 (which are similar to lower troughs 16 beneath each mount 14) into front trough 26. These cables can then be lead to upstream or downstream telecommunications equipment mounted in adjacent racks or elsewhere. As shown in FIG. 3, a pair of bend radius protection guards 48 are provided at the bottom of cable channel 20 between cable channel 20 and the vertical cable channel defined by cable guides 18.

Referring now also to FIG. 2, rack 10 also includes a pair of vertical supports 32, one of which extends upward adjacent to each of opposing sides 30 of base 24. Mounts 14 are attached to vertical supports 32, and a top support 31 extends between both vertical supports 32 and rear wall 40 of cable channel 20. A plurality of brackets 38 are mounted to the rear of rack 10 and also horizontally span between vertical supports 32 and rear wall 40 of cable channel 20.

Figure 13:
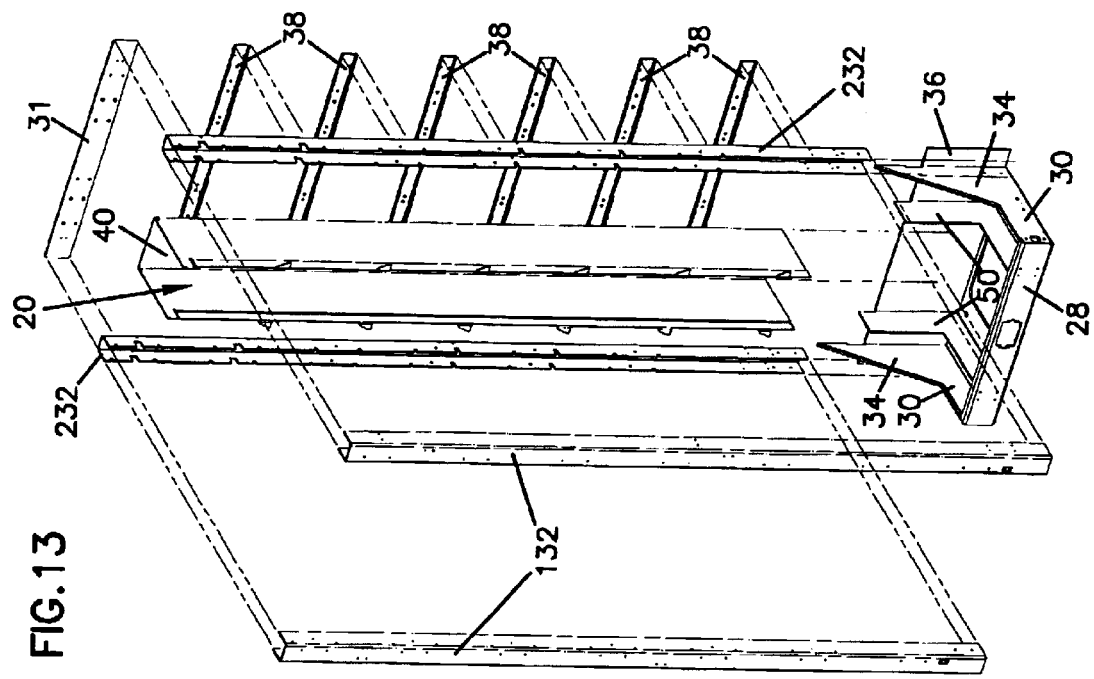
FIG. 13 is a front perspective exploded view of the rack of FIG. 11.
Figure 12:
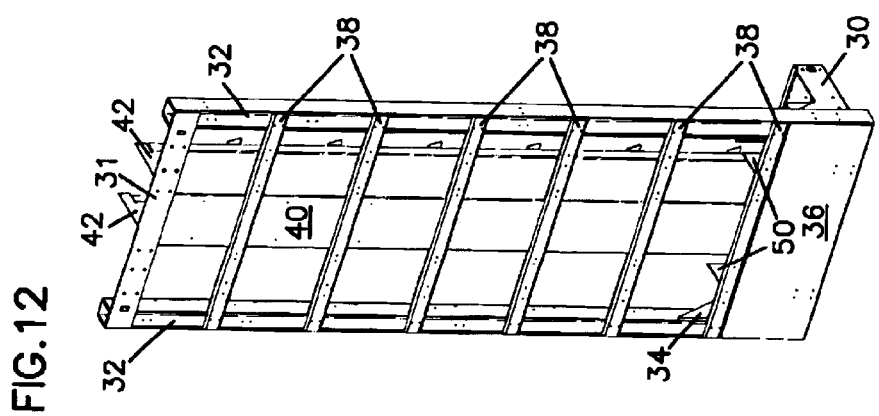
FIG. 12 is a rear perspective view of the rack of FIG. 11.
Figure 11:
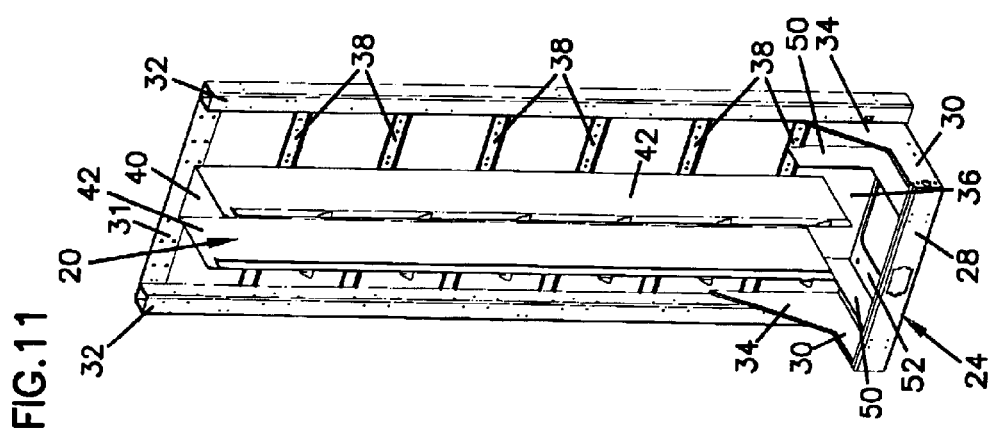
FIG. 11 is a front perspective view of the telecommunications racks of FIGS. 1 and 6, with modules, troughs and other items removed for clarity.

Referring now FIG. 3, reinforcing a physical connection between base 24 and vertical supports 32 is a pair of triangular gussets 34 and a pair of L-shaped gussets 50. As shown in FIG. 3, gussets 34 include two elements. A first element 34A is a separate piece from the base and extends vertically along an inner wall of one of the opposing sides 30 of base 24. A second element 34B is an extension of side 30 of base 24 and extends upward along an inner side of vertical support 32 and is sandwiched between element 34A and vertical support 32. Alternatively, gusset 34 could be either element 34A or element 34B alone. As shown in more detail in FIGS. 5, 11 and 13, discussed below, gussets 50 extend from the lowest mounted bracket 38, along base rear wall 36 and a floor 52 of base 24. Neither gusset 34 or gusset 50 extend forward to intrude into front trough 36.

To ensure the stability of rack 10 when subjected to stresses such as those generated in an earthquake or similar event, the connections between vertical supports 32, rear wall 40, brackets 38 and top support 31 may be welded which provides a larger and stronger joined area than provided by mechanical fasteners such as screws or rivets. For similar reasons, gussets 34 are welded to base 24 and vertical supports 32, and gussets 50 are welded to floor 52, base rear wall 36 and the lowest mounted bracket 38. Further, front wall 28, opposing sides 30, floor 52 and base rear wall 36 are welded together to make up base 24.

Figure 7:
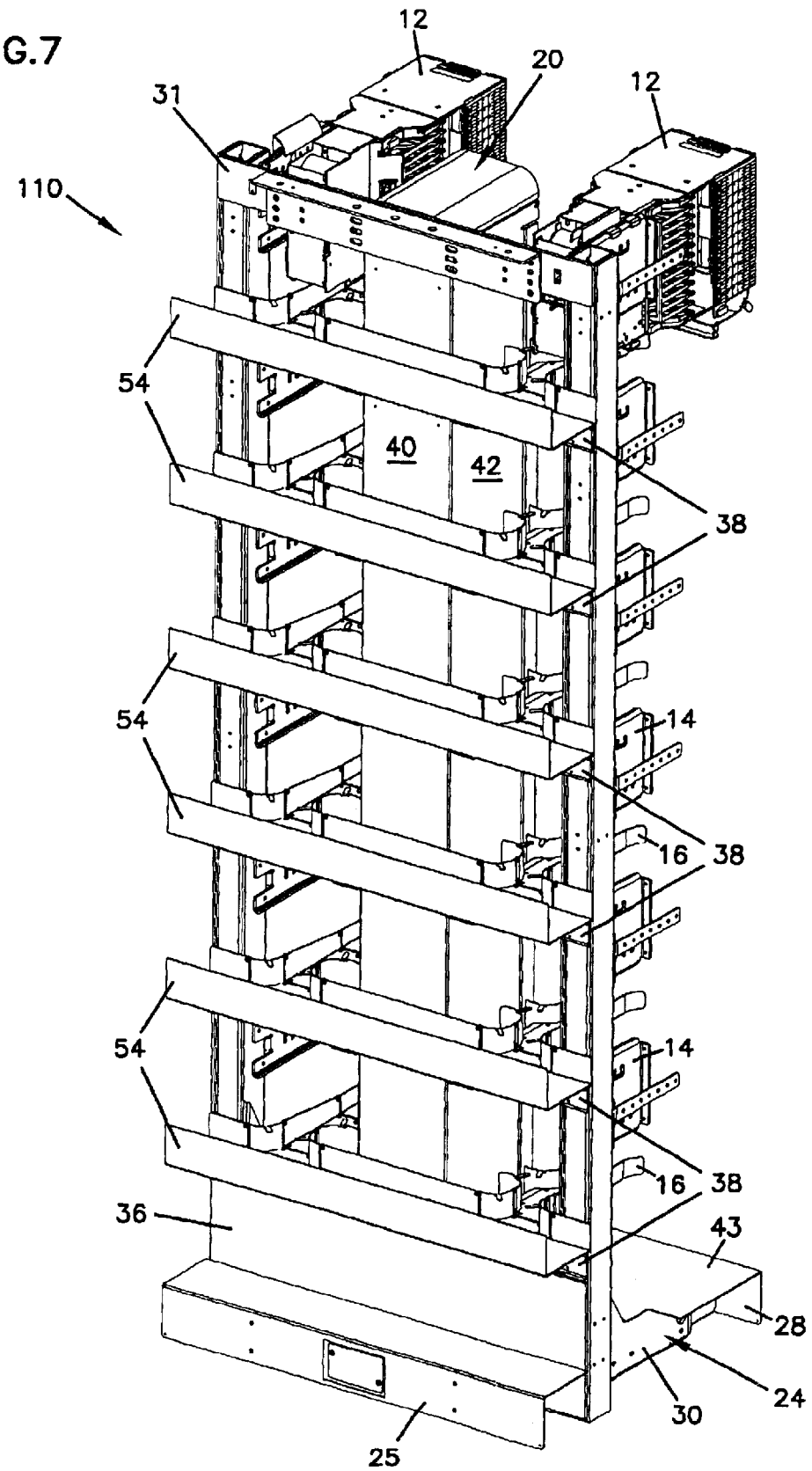
FIG. 7 is a rear perspective view of the telecommunications equipment rack of FIG. 6.
Figure 8:
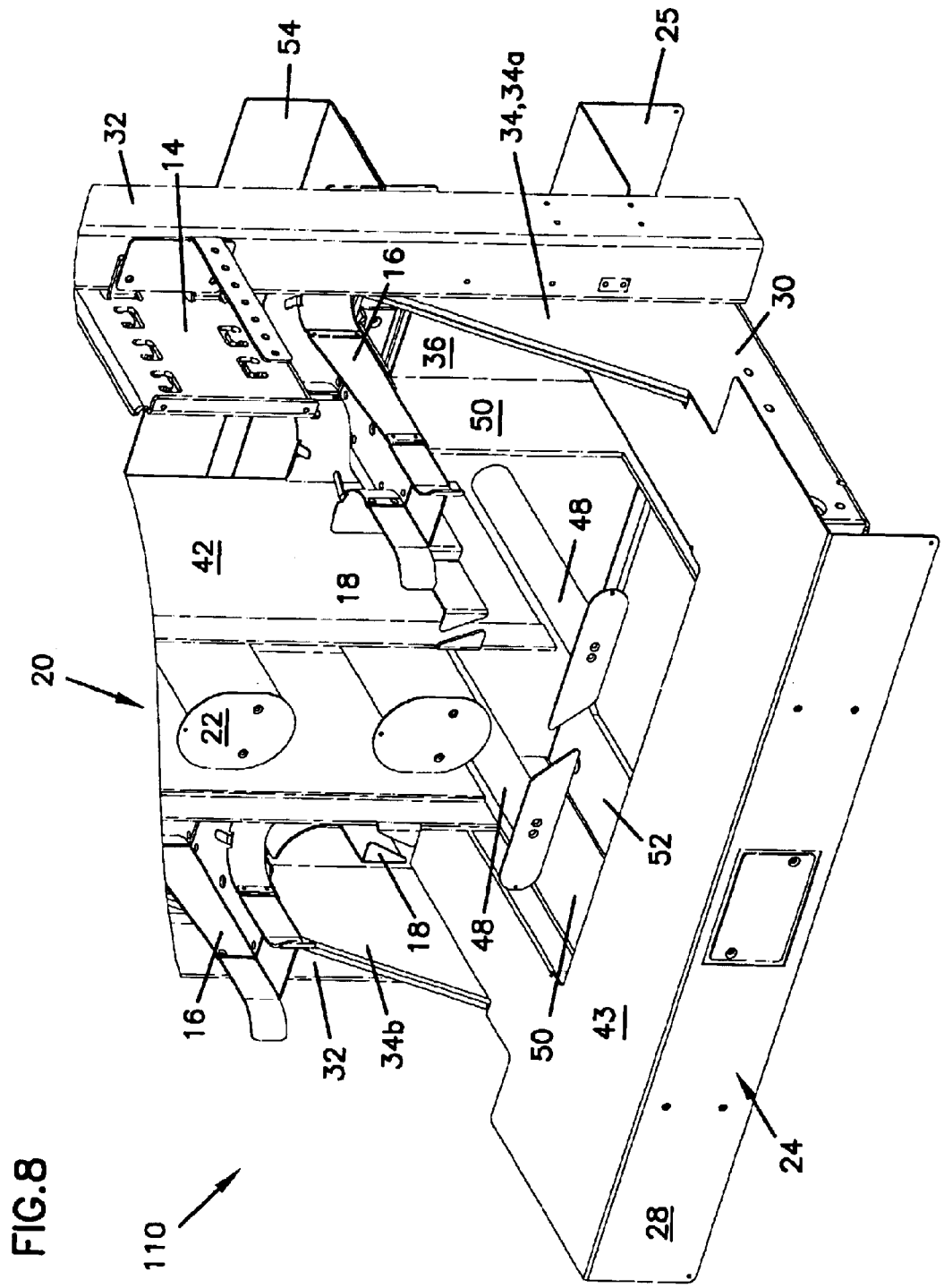
FIG. 8 is a front perspective view of the base of the telecommunications equipment rack of FIG. 6.
Figure 9:
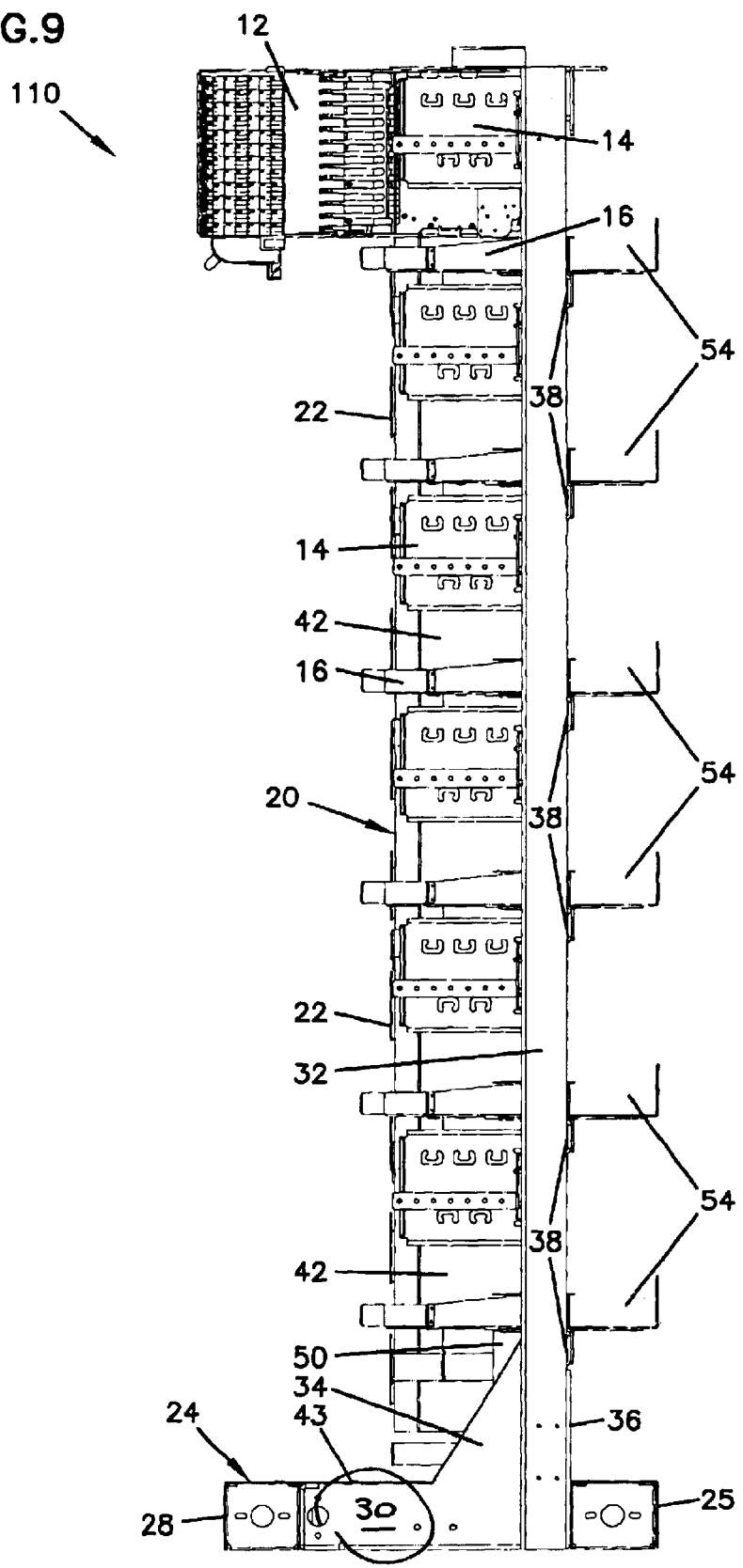
FIG. 9 is a side view of the telecommunications equipment rack of FIG. 6.
Figure 10:
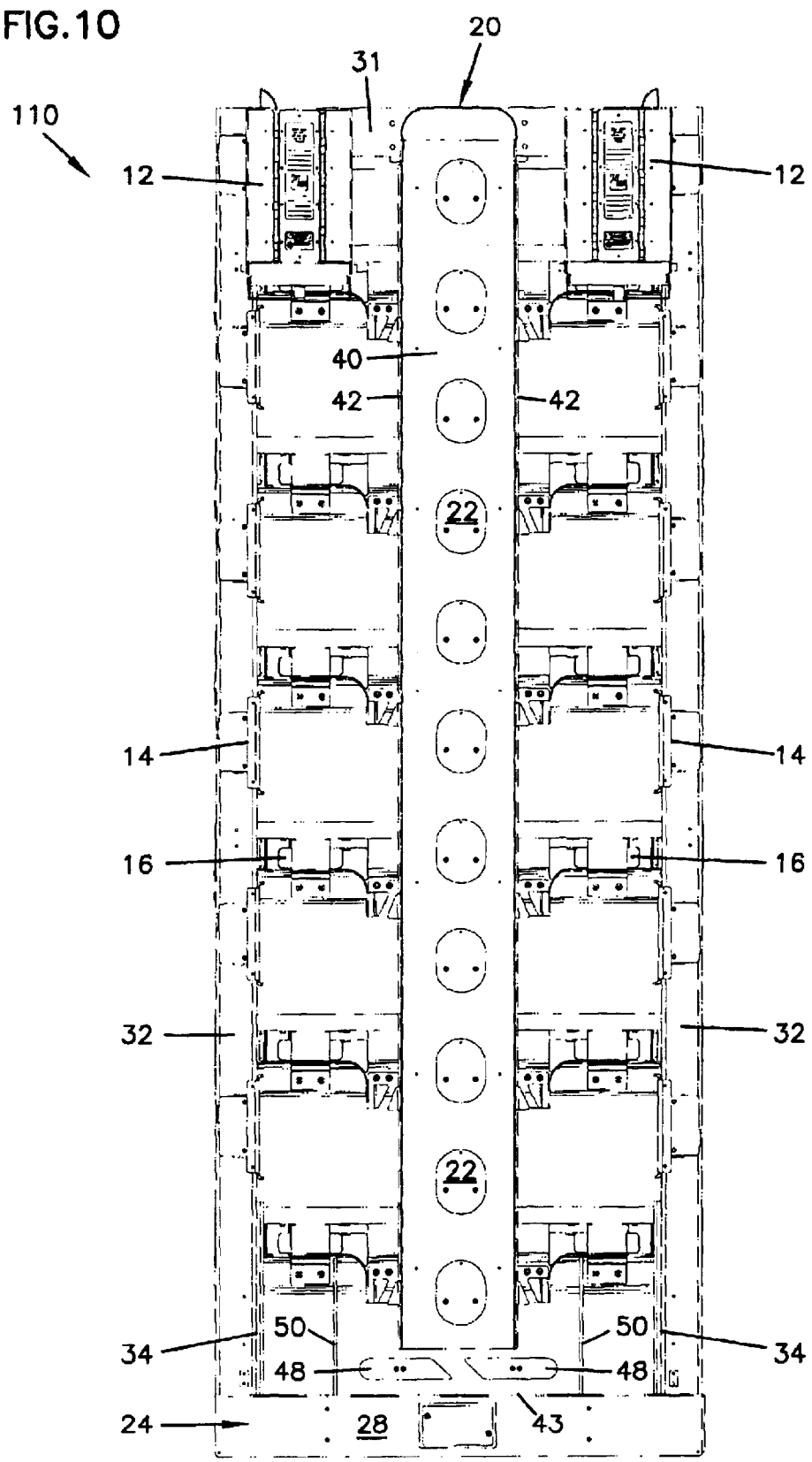
FIG. 10 is a front view of the telecommunications equipment rack of FIG. 6.

FIGS. 6 through 10 show a similar telecommunications equipment rack 110 including the same structural elements as rack 10, above. Rack 110 is configured to route optical fiber cables extending to and from fiber termination blocks 12 in a plurality rear cable troughs 54. Rear troughs 54 are mounted to rack 110 and extend between vertical supports 32 and rear wall 40 of cable channel 20 adjacent to brackets 38. Lower troughs 16 adjacent equipment mounts 14 are configured to allow optical fiber cables within lower troughs 16 to pass into rear troughs 54, as shown in FIG. 7. The elements described above with regard to rack 10 are also found in rack 110, including vertical supports 32, gussets 34 and 50, brackets 38 and base 24, and these elements serve substantially the same functions described above. Also note that base 24 of rack 110 has a rear extension 25 extending rearward beyond vertical supports 32 beneath rear troughs 54. Extension 25 is not a structural element of base 24 but serves to increase the footprint of base 24 so that no portion of rack 110 extends outside the footprint of base 24.

Also substantially similar to rack 10, rack 110 is welded to ensure that rack 110 is capable of withstanding earthquakes and other dynamic loading events.

Alternatively, for either rack 10 or rack 110, other forms of mechanical bonding may be used in place of welding to assemble the elements which make up the racks. High strength adhesives which supply similar strength of connection to welding may be also used.

Referring now to FIGS. 11 through 15, some of the structural components of rack 10 and 110 are shown. Mounts 14, lower troughs 16, front trough 26, rear troughs 54, cable slack storage spools 22, fiber termination blocks 12 and other items have been removed for clarity of these structural components. The configuration and connections between gussets 34 and vertical support 32 and opposing sides 30 are the same as described and shown above. The configuration and connections between gussets 50 and lowest mounted bracket 38, base rear wall 36 and floor 52 are the same as described and shown above.

Vertical supports 32 include a first U-shaped channel 132 and a second U-shaped channel 232 which are combined to form rectangular vertical support 32. To ensure sufficient strength of rack 10 or 110, U-shaped channels 132 and 232 may be welded together to form vertical support 32.

FIGS. 16 through 19 show base 24 and the items making up base 24, including front wall 28, opposing sides 30, base rear wall 36, and floor 52. Base rear wall 36 includes extensions 60 extending beyond opposing sides 30. Elements 34A define an upper extension of opposing sides 30. Element 34A, side 30 and extension 60 cooperate to define a space 61 for mounting and connection of vertical support 32 along each side of base 24. Floor 52 includes an opening 62 for passage of optical fiber cables from rack 10 or 110 into an underfloor cableway, if rack 10 or 110 is installed in a raised floor environment. Floor 52 also includes a plurality of fastener openings 64 for connecting base 24 and rack 10 or 110 to a floor of an installation location.

Element 34B of gusset 34 and gusset 50 on the right side of FIG. 15 are portions of a gusset right combination 56, which is shown in FIGS. 20 through 22. Element 34B of gusset 34 and gusset 50 on the left side of FIG. 15 are portions of a gusset left combination 58, which is shown in FIGS. 23 through 25. Gusset left combination 58 and gusset right combination 56 are mirror images of one another and are configured for mounting in the locations shown in FIGS. 11 through 15. Otherwise, these gusset combinations 56 and 58 are similar and will be described jointly.

Referring now also to FIGS. 20 through 25, gusset combinations 56 and 58 are shown. Each includes an L-shaped gusset 50 and a triangular gusset wall 70 with an element 34B forming an upward extension of gusset wall 70, and a web 66 extending between gusset 50 and gusset wall 70. Web 66 includes a plurality of fastener openings 68 configured to match the layout of openings 64 of floor 52. When gusset combinations 56 and 58 are mounted within base 24 with gusset wall 70 adjacent opposing sides 30, fastener openings 64 and 68 are aligned.

Alternatively, gussets 50 and 34 could be constructed without web 66 extending between them. Gusset wall 70 could then be welded to side 30 of base 24 with element 34B aligned with element 34A. Gusset 50 would be welded within base 24 extending between floor 52, base rear wall 36 and lowest mounted bracket 38 and welded into place so that gusset 50 does not obstruct either opening 62 or openings 64 of floor 52. As a further alternative, gusset 50 may be eliminated from rack 10 or 110 if gusset 34 provides sufficient reinforcement to make the rack earthquake resistant.

Figure 27:
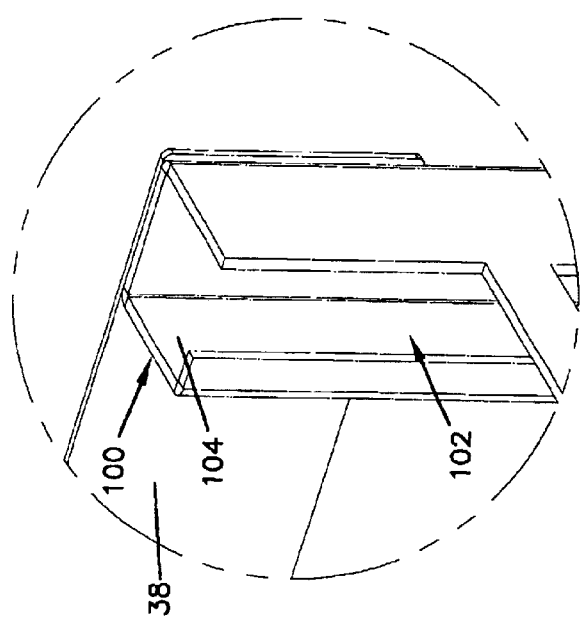
FIG. 27 is a front perspective view of an upper portion of the vertical support of FIG. 26.
Figure 26:
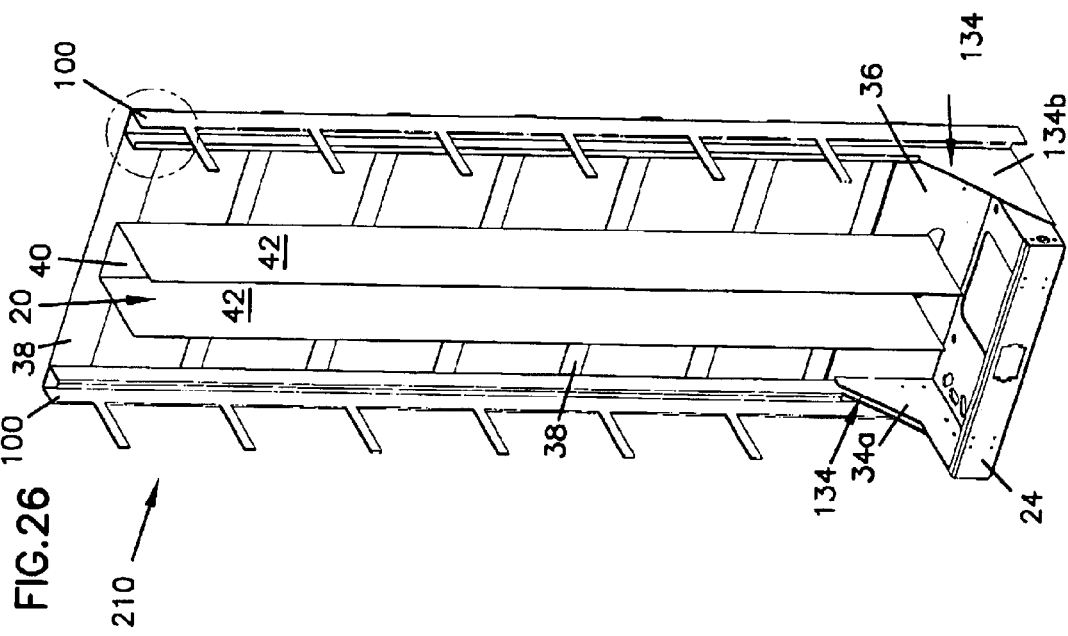
FIG. 26 is a front perspective view of an alternative embodiment of a rack with an alternative embodiment vertical support.

FIGS. 26 and 27 show an alternative embodiment telecommunications equipment rack 210 with vertical supports 100. Vertical support 100 is made of a single channel which is formed in an incomplete square, with a gap 102 in a front side. Manufacture of such a channel shape is simpler and less costly than extrusion or forming of a true, closed rectangular channel and provides sufficient strength for use in an earthquake resistant equipment rack. An inner wall 104 of vertical support includes a gusset element 134B at a bottom end. Base 24 is the same configuration as shown in racks 10 and 110 above, and sides 30 of base 24 include gusset elements 34A. Gusset elements 34A and 134B cooperate to form a gusset 134 which reinforces the connection between base 24 and vertical support 100. In this embodiment, element 134B is positioned to the outside of element 34, whereas in the prior embodiments, element 34B was positioned within base 24. Also, rack 210 does not include gussets 50, as sufficient strength may be provided by gusset 134 to make rack 210 sufficiently earthquake resistant.

Having described preferred aspects and embodiments of the present invention, modifications and equivalents of the disclosed concepts may readily occur to one skilled in the art. However, it is intended that such modifications and equivalents be included within the scope of the claims which are appended hereto.

What is claimed is:

1. A rack for mounting telecommunications equipment comprising:

a base having a front, a back, a floor and opposite ends;

a pair of spaced-apart supports extending vertically substantially from the ends of the base, each support including a first U-shaped channel and a second U-shaped channel mounted together to form a substantially rectangular enclosed tube with open ends of the U-shaped channels facing each other, each support including a plurality of mounting locations for mounting telecommunications equipment;

a center channel with an open front including opposing side walls and a rear wall extending vertically from the base between the vertical supports, the open front of the channel toward the front of the base with a plurality of cable slack storage structures extending from the rear wall within the center channel;

a plurality of horizontal brackets extending between the pair of vertical supports, each bracket attached to the rear wall of the center channel opposite the cable slack storage structures;

an L-shaped gusset extending between the lowest horizontal bracket, the back and the floor of the base; and a pair of triangularly shaped gussets, one reinforcing a connection between each vertical support and the base.

2. The rack of claim 1, wherein the first and second U-shaped channels are welded together to form the substantially rectangular tube.

3. The rack of claim 1, wherein the connections between the brackets and the vertical supports and the brackets and the rear wall of the center channel are welded.

4. The rack of claim 1, wherein each triangularly shaped gusset is welded to a vertical support and to the base.

5. The rack of claim 1, wherein each of the opposing sides includes an L-shaped gusset and each L-shaped gusset is welded to the adjacent vertical support.

6. The rack of claim 1, wherein each L-shaped gusset is welded to the lowest horizontal bracket, the back and the floor of the base.

7. The rack of claim 1, wherein each triangularly shaped gusset is connected with an L-shaped gusset to form a gusset assembly with the gussets substantially parallel to each other and connected and spaced apart by a horizontal web, the gusset assembly a unitary structure and the horizontal web mounted to the floor of the base.

8. The rack of claim 1, wherein the horizontal brackets include an upper and a lower flange extending from a first side of a vertical web, the first and second flanges extending away from the vertical web of the bracket substantially less than a height defined by the vertical web of the bracket and a second opposing side of the vertical web connected to the vertical supports and the rear wall of the center channel.

9. The rack of claim 1, wherein a cable trough is mounted to each horizontal bracket.

10. The rack of claim 1, wherein a cable trough is mounted to the base adjacent the front of the base, beneath the lowest telecommunications equipment mounting location and does not extend beyond the front of the base.

11. A rack for mounting telecommunications equipment comprising:

a base having a front, a back, a floor and opposite ends;

a vertical support extending vertically adjacent to each of the ends of the base, each vertical support a substantially rectangular tube and including a plurality of vertically spaced apart mounting locations for mounting telecommunications equipment;

a center channel with an open front including opposing side walls and a rear wall extending vertically from the base between the vertical supports, the open front of the center channel toward the front of the base with a plurality of cable slack storage structures extending from the rear wall within the center channel;

a plurality of horizontal brackets extending between the pair of vertical supports, each bracket attached to the rear wall of the center channel opposite the cable slack storage structures; and a lower portion of each vertical support forming a triangularly shaped gusset reinforcing a connection between the vertical support and the base.

12. The rack of claim 11, wherein each triangularly shaped gusset is welded to the base.

13. The rack of claim 12, wherein the horizontal brackets are welded to the vertical supports and to the rear wall of the center channel.

14. The rack of claim 13, wherein a cable trough is mounted to each horizontal bracket.

15. The rack of claim 13, wherein a cable trough is mounted to the base adjacent the front of the base, beneath the lowest telecommunications equipment mounting location and does not extend beyond the front of the base.

16. The rack of claim 11, wherein each end of the base includes a triangularly shaped gusset which cooperates with the triangularly shaped gusset of the vertical support adjacent the end to reinforce the connection between the vertical support and the base.

17. The rack of claim 16, wherein the triangle shaped gusset of each end of the base is welded to the triangularly shaped gusset of the vertical support adjacent the end.

18. The rack of claim 17, wherein the horizontal brackets are welded to the vertical supports and to the rear wall of the center channel.

19. The rack of claim 18, wherein a cable trough is mounted to each horizontal bracket.

20. The rack of claim 18, wherein a cable trough is mounted to the base adjacent the front of the base, beneath the lowest telecommunications equipment mounting location and does not extend beyond the front of the base.

21. The rack of claim 13, further comprising an L-shaped gusset extending between the lowest horizontal bracket, the back and the floor of the base.

22. The rack of claim 21, wherein a cable trough is mounted to each horizontal bracket.

23. The rack of claim 21, wherein a cable trough is mounted to the base adjacent the front of the base, beneath the lowest telecommunications equipment mounting location and does not extend beyond the front of the base.

* * * * *

UNITED STATES PATENT AND TRADEMARK OFFICE
CERTIFICATE OF CORRECTION

PATENT NO. : 6,920,273 B2
DATED : July 19, 2005
INVENTOR(S) : Knudsen

It is certified that error appears in the above-identified patent and that said Letters Patent is hereby corrected as shown below:

Column 7,
Lines 15-19, should read -- storage structures; a lower portion of each vertical support forming a triangularly shaped gusset reinforcing a connection between the vertical support and the base; and each end of the base including a triangularly shaped gusset which cooperates with the triangularly shaped gusset of the vertical support adjacent the end to reinforce the connection between the vertical support and the base. --.

Column 8,
Lines 1-5, Claim 16 should be deleted.
Line 6, "Claim 16," should read -- Claim 11, --.

Signed and Sealed this

Fourth Day of April, 2006

JON W. DUDAS
*Director of the United States Patent and Trademark Office*